US008530268B2

United States Patent
Kim

(10) Patent No.: US 8,530,268 B2
(45) Date of Patent: Sep. 10, 2013

(54) ORGANIC LIGHT-EMITTING DISPLAY DEVICE AND METHOD OF MANUFACTURING THE SAME

(75) Inventor: Bong-Ju Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 13/176,620

(22) Filed: Jul. 5, 2011

(65) Prior Publication Data

US 2012/0049169 A1    Mar. 1, 2012

(30) Foreign Application Priority Data

Aug. 24, 2010  (KR) ..................... 10-2010-0082098

(51) Int. Cl.
*H01L 51/50*    (2006.01)
(52) U.S. Cl.
USPC ............. 438/82; 438/99; 438/781; 257/40; 257/E33.012
(58) Field of Classification Search
USPC ............ 257/59, E33.012, E33.001, E21.409; 438/82, 99, 562, 780, 781
See application file for complete search history.

(56) References Cited

U.S. PATENT DOCUMENTS

| 6,414,343 | B1 * | 7/2002 | Kondo et al. | 257/294 |
| 7,507,597 | B2 * | 3/2009 | Jeon | 438/57 |
| 8,207,662 | B2 * | 6/2012 | Kwon et al. | 313/503 |
| 2002/0013020 | A1 * | 1/2002 | Kim et al. | 438/149 |
| 2002/0033927 | A1 * | 3/2002 | Mun et al. | 349/156 |
| 2006/0220545 | A1 | 10/2006 | Tao | |
| 2007/0196940 | A1 * | 8/2007 | Park et al. | 438/22 |
| 2009/0148970 | A1 * | 6/2009 | Hosoya et al. | 438/29 |

FOREIGN PATENT DOCUMENTS

| JP | 2007-273828 A | 10/2007 |
| KR | 10-2000-0051370 A | 8/2000 |
| KR | 10-2001-0091686 A | 10/2001 |
| KR | 10-2006-0100122 A | 9/2006 |
| KR | 10-2007-0037057 A | 4/2007 |
| KR | 10-2008-0078164 A | 8/2008 |

* cited by examiner

*Primary Examiner* — Cuong Q Nguyen
*Assistant Examiner* — Yosef Gebreyesus
(74) *Attorney, Agent, or Firm* — Christie, Parker & Hale, LLP

(57) ABSTRACT

An organic light-emitting display device includes a pixel electrode and a pixel defining layer which are formed by using one mask process. A method for manufacturing the display includes thermally reflowing a remaining portion of a photo-sensitive organic film that is used as a mask to form the pixel electrode to be the pixel defining layer.

5 Claims, 4 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2010-0082098, filed on Aug. 24, 2010, in the Korean Intellectual Property Office, the content of which is incorporated herein in its entirety by reference.

BACKGROUND

1. Field

The present invention relates to an organic light-emitting display device and a method of manufacturing the same.

2. Description of the Related Art

An organic light-emitting display device is a self-emission type display device that includes a pixel electrode, an opposite electrode, and an organic emissive layer interposed between the pixel electrode and the opposite electrode, wherein when a positive voltage and a negative voltage are applied to the electrodes, light is emitted from the organic emissive layer, thereby forming an image.

A pixel defining layer is formed on an edge of the pixel electrode and surrounds the pixel electrode. The pixel defining layer surrounds each pixel to form a boundary defining each pixel as an independent entity, and prevents short circuits due to direct contact between the pixel electrode and the opposite electrode at the edge of the pixel electrode.

However, in order to manufacture the structure described above, in the related art, the pixel electrode is patterned and then the pixel defining layer is patterned. Thereafter, the organic emissive layer and the opposite electrode are sequentially formed. Accordingly, the pixel electrode and the pixel defining layer are formed using different mask processes, which makes the manufacturing process a complicated process. That is, one mask is used to form the pixel electrode and another mask is used to form the pixel defining layer on the pixel electrode, so that two mask processes are needed to form the pixel electrode and the pixel defining layer.

SUMMARY

Aspects of embodiments according to the present invention are directed toward an organic light-emitting display device including a pixel electrode and a pixel defining layer which are formed by using one mask process, thereby simplifying the manufacturing process, and a method of manufacturing the same.

According to an embodiment of the present invention, there is provided an organic light-emitting display device including: a pixel electrode electrically coupled to a thin-film transistor; a pixel defining layer covering an edge of the pixel electrode and surrounding the pixel electrode to define a pixel region; an opposite electrode facing the pixel electrode; and an organic emissive layer interposed between the pixel electrode and the opposite electrode, wherein the pixel defining layer is formed via a thermal reflow process on a photo-sensitive organic film.

The photo-sensitive organic film includes an olefin-based organic film, an acryl-based organic film, or an imide-based organic film.

According to another embodiment of the present invention, there is provided a method of manufacturing an organic light-emitting display device, the method including: (a) sequentially forming a pixel electrode layer and a photo-sensitive organic film; (b) preparing a mask including a first transmission portion, a second transmission portion, and a third transmission portion which have different light transmission rates from each other; (c) positioning the mask on the photo-sensitive organic film such that the first transmission portion corresponds to a portion of the pixel electrode layer that is to be a pixel electrode, the second transmission portion corresponds to a portion of the pixel electrode layer that is to be removed, and the third transmission portion corresponds to a portion of the photo-sensitive organic film that is to be a pixel defining layer at an edge of the pixel electrode; (d) selectively exposing and removing the photo-sensitive organic film such that the pixel electrode layer is exposed and the portion of the photo-sensitive organic film that is to be the pixel defining layer remains; and (e) thermally reflowing a remaining portion of the photo-sensitive organic film that is to be the pixel defining layer such that the photo-sensitive organic film reflows to cover the edge of the pixel electrode.

The operation (d) includes: removing the photo-sensitive organic film such that a portion of the photo-sensitive organic film corresponding to the portion of the pixel electrode layer that is to be removed is removed, a portion of the photo-sensitive organic film corresponding to the portion of the pixel electrode layer that is to be the pixel electrode remains with a first thickness, and the portion of the photo-sensitive organic film that is to be the pixel defining layer remains with a second thickness larger than the first thickness; etching the portion of the pixel electrode layer corresponding to the removed portion of the photo-sensitive organic film and removing the portion of the photo-sensitive organic film corresponding to the portion of the pixel electrode layer that is to be the pixel electrode, so as to expose the pixel electrode, except the portion of the photo-sensitive organic film that is to be the pixel defining layer.

According to an embodiment of the present invention, a method of manufacturing an organic light-emitting display device is provided. The method includes: forming a photo-sensitive organic film on a pixel electrode layer; selectively exposing and removing the photo-sensitive organic film such that a portion of the pixel electrode layer is exposed and removed to form a pixel electrode with a remaining portion of the photo-sensitive organic film thereon, a first portion of the remaining portion being at an edge of the pixel electrode and having a thickness larger than other portions of the remaining portion; removing the other portions of the remaining portion; and thermally reflowing the first portion of remaining portion to cover an edge of the pixel electrode.

The photo-sensitive organic film may include an olefin-based organic film, an acryl-based organic film, or an imide-based organic film.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described in detail with reference to enclosed drawings.

Figure 1:
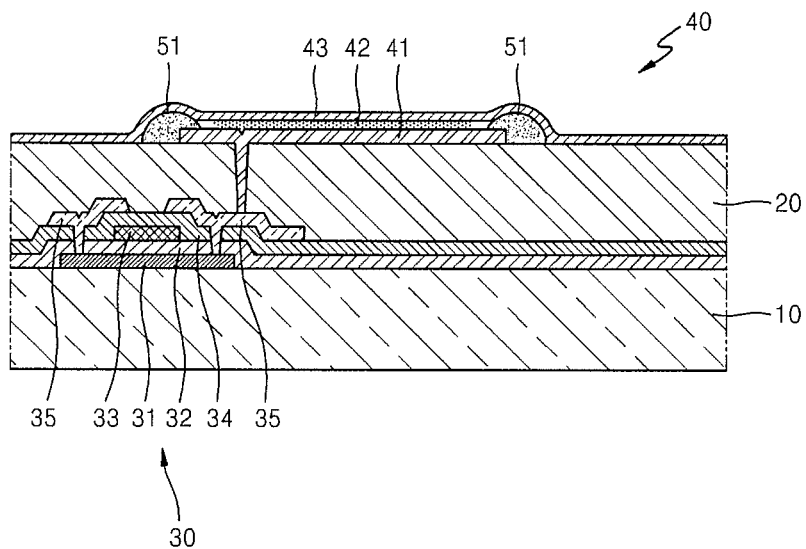
FIG. 1 is a cross-sectional view of an organic light-emitting display device according to an embodiment of the present invention.

FIG. 1 is a cross-sectional view of an organic light-emitting display device according to an embodiment of the present invention.

Referring to FIG. 1, the organic light-emitting display device according to an embodiment of the present embodiment includes a substrate 10, a thin-film transistor 30, and an organic light-emitting device 40 that are formed on the substrate 10. The organic light-emitting device 40 includes a pixel electrode 41, an organic emissive layer 42, and an opposite electrode 43. Here, the organic light-emitting display device includes a plurality of pixels, but FIG. 1 illustrates only one of the pixels, for convenience of description.

Here, the thin-film transistor 30 includes an active layer 31 (e.g., a semiconductor layer) formed on the substrate 10, a first insulating layer 32 covering the active layer 31, a gate electrode 33 formed on the first insulating layer 32, a second insulating layer 34 that is formed on the first insulating layer 32 and covers the gate electrode 33, and source and drain electrodes 35 respectively coupled to the active layer 31 and of which one is coupled to the pixel electrode 41 of the organic light-emitting device 40 through one or more via-holes. Accordingly, when an appropriate voltage is applied to the gate electrode 33, a current flows to the pixel electrode 41 through the active layer 31 and the source and drain electrodes 35.

In one embodiment, a buffer layer for planarizing the substrate 10 and preventing permeation of impurity elements may be further formed on an upper surface of the substrate 10.

A passivation layer 20 may be formed of an inorganic insulating material or an organic insulating material. Examples of an inorganic insulating material for use in the passivation layer 20 include $SiO_2$, SiNx, SiON, $Al_2O_3$, $TiO_2$, $Ta_2O_5$, $HfO_2$, $ZrO_2$, BST, and PZT. Examples of an organic insulating material for use in the passivation layer 20 include generally available polymers including poly(methyl methacrylate) (PMMA) and polystyrene (PS), a polymer derivative including a phenol group, an acryl-based polymer, an imide-based polymer, an aryl ether-based polymer, an amide-based polymer, a fluoride-based polymer, a p-xylene based polymer, a vinyl alcohol-based polymer, and a blend of thereof. In addition, the passivation layer 20 may have a composite stack structure including an inorganic insulating material and an organic insulating material.

The pixel electrode 41 of the organic light-emitting device 40 contacting one of the source and drain electrodes 35, as described above, may be formed on the passivation layer 20.

In addition, a pixel defining layer 51 is formed on the passivation layer 20. The pixel defining layer 51 surrounds the pixel electrode 41 to define an independent pixel region. The organic emissive layer 42 and the opposite electrode 43 of the organic light-emitting device 40 are sequentially formed on the pixel electrode 41 in the stated order.

The organic light-emitting device 40 will now be described in more detail. The organic light-emitting device 40 is electrically coupled to the thin-film transistor 30 and emits light when driven. As described above, the organic light-emitting device 40 includes the pixel electrode 41 coupled to the thin-film transistor 30, the opposite electrode 43 as a common electrode, and the organic emissive layer 42 interposed between the pixel electrode 41 and the opposite electrode 43. Accordingly, when a voltage is applied to the pixel electrode 41 by the thin-film transistor 30 and an appropriate voltage condition is formed between the pixel electrode 41 and the opposite electrode 43, light is emitted from the organic emissive layer 42.

When the organic light-emitting display device has a front emission-type structure and thus an image is displayed toward the opposite electrode 43, the pixel electrode 41 may be a reflective electrode. When the pixel electrode 41 is a reflective electrode, the pixel electrode 41 may include a reflective film formed of Al, Ag, or an alloy thereof.

When the pixel electrode 41 is an anode, the pixel electrode 41 may include a layer formed of metal oxide having a relatively high work function absolute value, such as ITO, IZO, or ZnO. When the pixel electrode 41 is a cathode, the pixel electrode 41 may include a highly conductive metal with a relatively low work function absolute value, such as Ag, Mg, Al, Pt, Pd, Au, Ni, Nd, Ir, Cr, Li, or Ca. Accordingly, in the latter case, the reflective film may not be included.

The opposite electrode 43 may be a light-transmissible electrode (e.g., a transparent electrode). In this regard, the opposite electrode 43 may include a semi-transmissible reflective film formed of Ag, Mg, Al, Pt, Pd, Au, Ni, Nd, Ir, Cr, Li, or Ca or a light-transmissible metal oxide such as ITO, IZO, or ZnO. When the pixel electrode 41 is an anode, the opposite electrode 43 is a cathode, and when the pixel electrode 41 is a cathode, the opposite electrode 43 is an anode.

The organic emissive layer 42 interposed between the pixel electrode 41 and the opposite electrode 43 may include at least one layer selected from the group consisting of a hole injection layer, a hole transport layer, an emissive layer, an electron injection layer, an electron transport layer, and other suitable layers. In one embodiment, the organic emissive layer 42 includes an emissive layer.

Also, the pixel defining layer 51 may include a photo-sensitive organic film on which a thermal reflow process is performable. In regard to the thermal reflow process, when an organic film is suitably heated, the heated portion is melted and flows to a surrounding portion. When a suitable amount (e.g., a large amount) of solvent is included in the organic film, good fluidity may be obtained during heating and thus thermal reflowing may easily occur. For example, an olefin-based organic film, an acryl-based organic film, or an imide-based organic film may be used, and a degree of thermal reflow may be appropriately controlled by increasing or decreasing the amount of the solvent. That is, the pixel defining layer 51 is formed together with the pixel electrode 41 by thermal reflow, instead of photolithography, which is conventionally used to form the pixel defining layer 51. That is, the thermal reflow process may enable the pixel defining layer 51 and the pixel electrode 41 to be concurrently (e.g., simultaneously) patterned using a mask once.

Figure 2A:
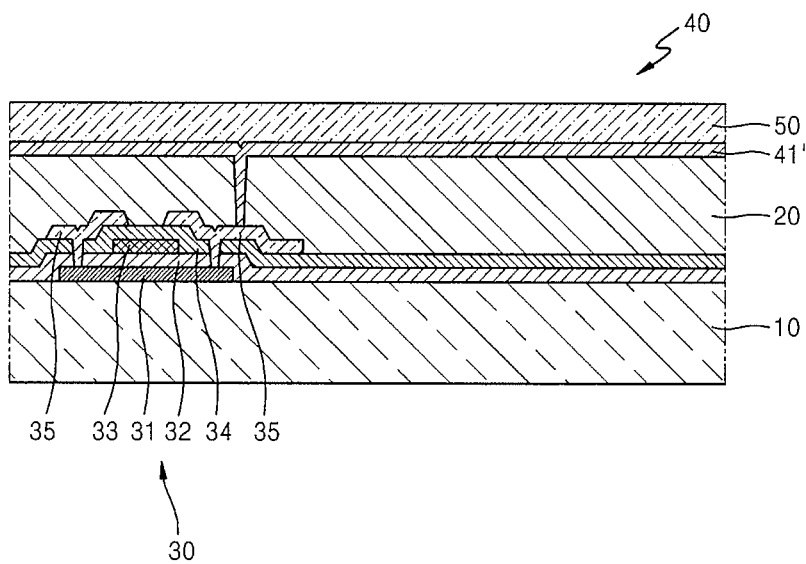
FIGS. 2A through 2E are cross-sectional views illustrating a method of manufacturing the organic light-emitting display device of FIG. 1.
Figure 2B:
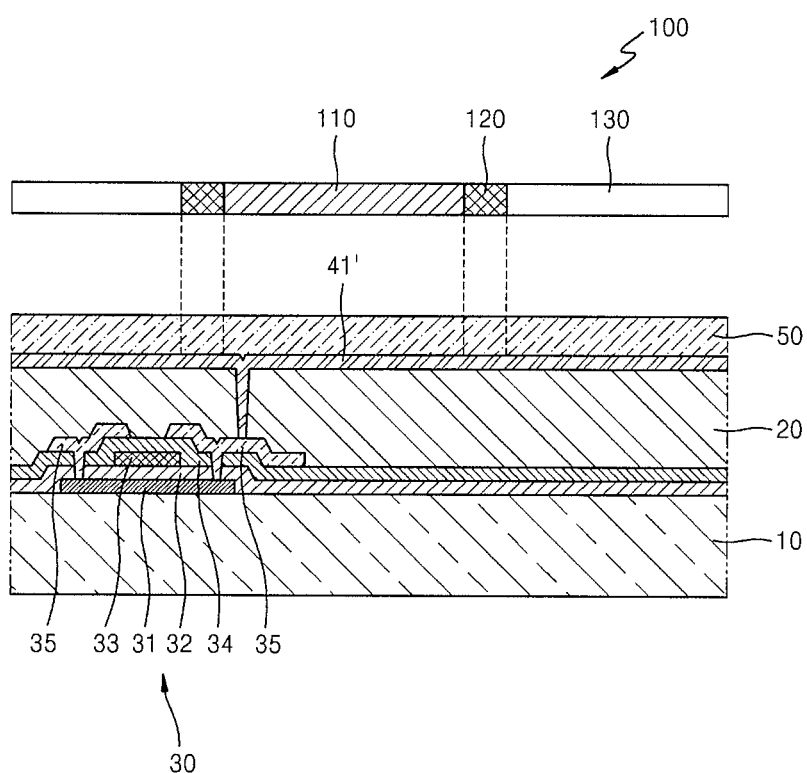

To accomplish the above process, according to one embodiment, a halftone mask 100 is used as illustrated in FIG. 2B.

Hereinafter, a method of forming the pixel defining layer 51 and the pixel electrode 41 using the halftone mask 100 will be described in more detail.

First, as illustrated in FIG. 2A, a photo-sensitive organic film 50 that is to be the pixel defining layer 51 is formed on a pixel electrode layer 41' that is to be the pixel electrode 41. The photo-sensitive organic film 50 may include a suitable amount of solvent that the thermal reflow occurs, and may be an olefin-based organic film, an acryl-based organic film, or an imide-based organic film.

Then, as illustrated in FIG. 2B, an exposure process is performed on the photo-sensitive organic film 50 using the halftone mask 100. In this regard, a portion of the photo-sensitive organic film 50 corresponding to a portion of the pixel electrode layer 41' that is to be removed using the halftone mask 100, a portion of the photo-sensitive organic film 50 corresponding to a portion of the pixel electrode layer 41' that is to be the pixel electrode 41, and a portion of the photo-sensitive organic film 50 that is to be the pixel defining layer 51 are exposed at different exposure degrees.

The halftone mask 100 includes a first transmission portion 110 through which 50% of incident light passes, a second transmission portion 120 through which incident light does not pass, and a third transmission portion 130 through which 100% of incident light passes. The halftone mask 100 is positioned such that the first transmission portion 110 corresponds to the portion of the photo-sensitive organic film 50 corresponding to the portion of the pixel electrode layer 41' that is to be the pixel electrode 41 contacting the organic emissive layer 42, the third transmission portion 130 corresponds to the portion of the photo-sensitive organic film 50 corresponding to the portion of the pixel electrode layer 41' that is to be removed, and the second transmission portion 120 corresponds to the portion of the photo-sensitive organic film 50 that is to be the pixel defining layer 51, and then, the exposure process is performed.

Then, the fully exposed portion of the photo-sensitive organic film 50 by the third transmission portion 130 is completely removed in a subsequent removal process, thereby exposing the pixel electrode layer 41', the screened (non-exposed) portion of the photo-sensitive organic film 50 by the second transmission portion 120 remains and becomes the pixel defining layer 51 later. The semi-exposed portion of the photo-sensitive organic film 50 by the first transmission portion 110 remains partially.

Figure 2C:
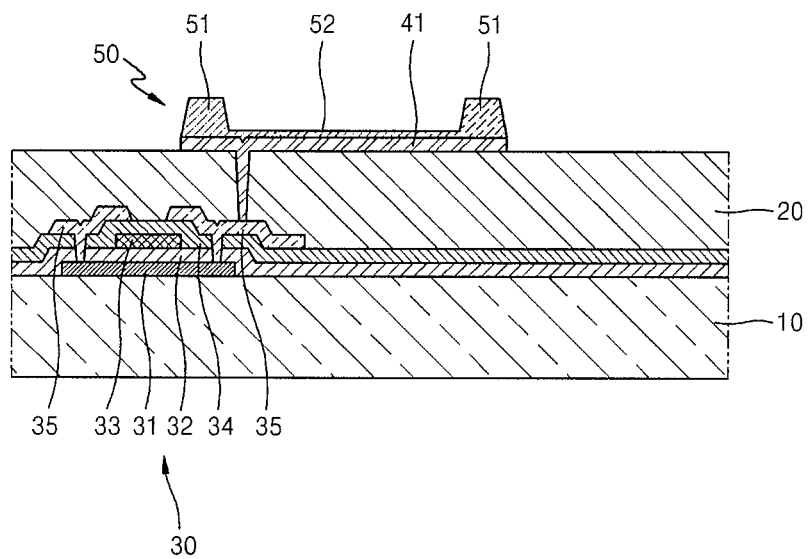

In this state, the portion of the pixel electrode layer 41' corresponding to the fully exposed portion of the photo-sensitive organic film 50 by the third transmission portion 130 is removed by etching, thereby forming the pattern of the pixel electrode 41 illustrated in FIG. 2C. In this case, a portion 52 of the photo-sensitive organic film 50 on the pixel electrode 41 is relatively thin, and the portion of the photo-sensitive organic film 50 that is to be the pixel defining layer 51 on upper edge portions of the pixel electrode 41 is relatively thick.

Figure 2D:
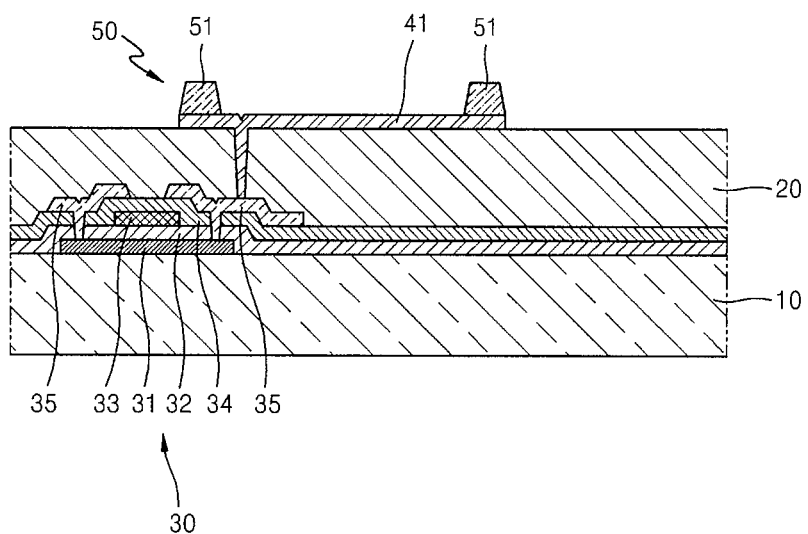

Then, the portion 52 of the photo-sensitive organic film 50 is removed to expose the pixel electrode 41 while the upper edge portions of the pixel electrode 41 on which the pixel defining layer 51 is formed are not exposed. In this regard, dry etching or wet etching may be used, and as illustrated in FIG. 2D, the portion 52 of the photo-sensitive organic film 50 remaining on the pixel electrode 41 is completely removed. As a result, the pixel electrode 41 that is to contact the organic emissive layer 42 is exposed, and the pixel defining layer 51 has a certain shape. However, side edge portions of the pixel electrode 41 are still exposed. Thus, if an electrode is formed on the resultant structure, the opposite electrode 43 may directly contact the exposed side edge portions of the pixel electrode 41 and a short circuit may occur. Thus, it is desirable to cover the exposed side edge portions of the pixel electrode 41.

Figure 2E:
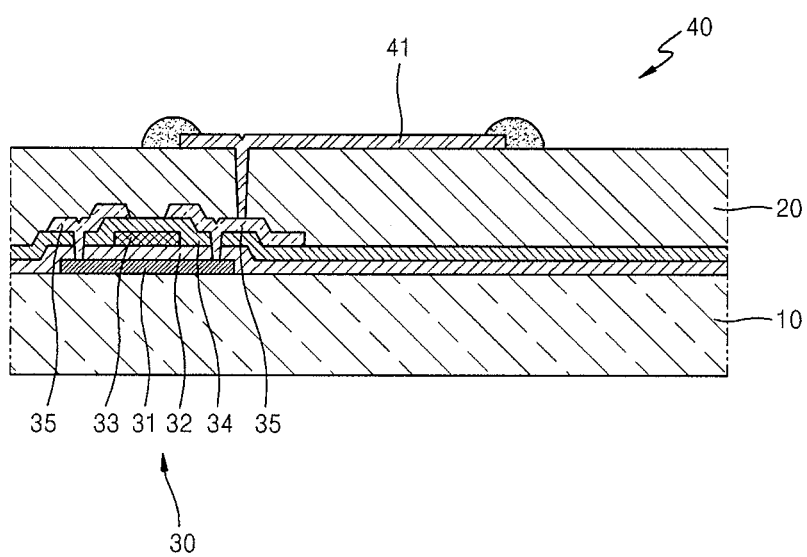

Then, a thermal reflow process is performed by heating the pixel defining layer 51. Accordingly, the pixel defining layer 51 is melted and flows down to cover the edges of the pixel electrode 41 as illustrated in FIG. 2E.

As described above, the pixel electrode 41 and the pixel defining layer 51 are formed by using only one mask process. In the related art, the pixel electrode 41 and the pixel defining layer 51 are formed using two different mask processes. However, according to the above described embodiments of the present invention, only one mask process is used to obtain the same effect.

As a comparative example, a conventional method of forming a pixel electrode and a pixel defining layer will now be described briefly. A pixel electrode layer is formed and then a photoresist layer is formed thereon. Then, the pixel electrode layer is patterned using a mask and etched to form a pixel electrode. Subsequently, a layer that is to be a pixel defining layer is formed on the resultant structure and then a photoresist layer is formed on the layer. Then, another mask is used to pattern the layer and the patterned layer is etched to form a pixel defining layer. Accordingly, in the related art, in order to form a pixel electrode and a pixel defining layer, a pixel electrode layer and a layer that is to be the pixel defining layer are formed separately, a photoresist layer is formed twice, and two mask processes are performed. However, according to the above embodiment of the present invention, the pixel electrode 41 and the pixel defining layer 51 are able to be formed using one photo-sensitive organic film formation process and one mask process. Thus, the formation process may be simplified. That is, the process for forming the photoresist layer for patterning the pixel electrode and the process for forming the layer that is to be the pixel defining layer are not used, and the patterning of the pixel electrode 41 and the formation of the pixel defining layer 51 are performed using only the photo-sensitive organic film 50. In other words, the photo-sensitive organic film 50 may function as a photoresist layer for patterning the pixel electrode 41 and as the pixel defining layer 51.

As described above, the pixel electrode 41 and the pixel defining layer 51 are formed, and then the organic emissive layer 42 is formed on the pixel electrode 41 and the opposite electrode 43 as a common electrode is formed on the resultant structure, thereby completely manufacturing an organic light-emitting display device illustrated in FIG. 1.

Although not illustrated in FIG. 1, a protection layer may be further formed on the opposite electrode 43, and the organic light-emitting device is sealed with glass.

As described above, in regard to an organic light-emitting display device according to an embodiment of the present invention and a method of manufacturing the same, a pixel electrode and a pixel defining layer are formed using one mask process using a halftone mask. Thus, the manufacturing process is simplified. In addition, in a thermal reflow process, a pixel defining layer is formed by melting a photo-sensitive organic film, and the thickness of the pixel defining layer may be less than those of conventional products, which may be suitable for products with a thin profile.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device, the method comprising:
   (a) sequentially forming a pixel electrode layer and a photo-sensitive organic film;
   (b) preparing a mask comprising a first transmission portion, a second transmission portion, and a third transmission portion which have different light transmission rates from each other;
   (c) positioning the mask on the photo-sensitive organic film such that the first transmission portion corresponds to a portion of the pixel electrode layer that is to be a pixel electrode, the second transmission portion corresponds to a portion of the pixel electrode layer that is to be removed, and the third transmission portion corresponds to a portion of the photo-sensitive organic film that is to be a pixel defining layer at an edge of the pixel electrode;

(d) selectively exposing and removing the photo-sensitive organic film such that the pixel electrode layer is exposed and the portion of the photo-sensitive organic film that is to be the pixel defining layer remains; and (e) thermally reflowing a remaining portion of the photo-sensitive organic film that is to be the pixel defining layer such that the photo-sensitive organic film reflows to cover the edge of the pixel electrode.

2. The method of claim 1, wherein the operation (d) comprises:

removing the photo-sensitive organic film such that a portion of the photo-sensitive organic film corresponding to the portion of the pixel electrode layer that is to be removed is removed, a portion of the photo-sensitive organic film corresponding to the portion of the pixel electrode layer that is to be the pixel electrode remains with a first thickness, and the portion of the photo-sensitive organic film that is to be the pixel defining layer remains with a second thickness larger than the first thickness;

etching the portion of the pixel electrode layer corresponding to a removed portion of the photo-sensitive organic film; and removing the portion of the photo-sensitive organic film corresponding to the portion of the pixel electrode layer that is to be the pixel electrode, so as to expose the pixel electrode, except the portion of the photo-sensitive organic film that is to be the pixel defining layer.

3. The method of claim 1, wherein the photo-sensitive organic film comprises an olefin-based organic film, an acryl-based organic film, or an imide-based organic film.

4. A method of manufacturing an organic light-emitting display device, the method comprising:

forming a photo-sensitive organic film on a pixel electrode layer;

selectively exposing and removing the photo-sensitive organic film such that a portion of the pixel electrode layer is exposed and removed to form a pixel electrode with a remaining portion of the photo-sensitive organic film thereon, a first portion of the remaining portion being at an edge of the pixel electrode and having a thickness larger than other portions of the remaining portion;

removing the other portions of the remaining portion; and thermally reflowing the first portion of the remaining portion to cover an edge of the pixel electrode.

5. The method of claim 4, wherein the photo-sensitive organic film comprises an olefin-based organic film, an acryl-based organic film, or an imide-based organic film.

* * * * *